United States Patent [19]
Mori

[11] Patent Number: 5,243,288
[45] Date of Patent: Sep. 7, 1993

[54] MULTIPLE COIL TYPE MAGNETIC RESONANCE IMAGING SYSTEM INCLUDING FILTERS WITH DIFFERENT PASSBANDS

[75] Inventor: Issei Mori, Nishinasunomachi, Japan

[73] Assignee: Kabushiki Kaisha Toshiba, Kanagawa, Japan

[21] Appl. No.: 731,074

[22] Filed: Jul. 16, 1991

[30] Foreign Application Priority Data

Jul. 18, 1990 [JP] Japan .................................. 2-188139

[51] Int. Cl.$^5$ .......................................... G01R 33/20
[52] U.S. Cl. .................................... 324/322; 324/314
[58] Field of Search ............... 324/300, 307, 309, 310, 324/311, 312, 313, 314, 318, 322

[56] References Cited

U.S. PATENT DOCUMENTS

| | | | |
|---|---|---|---|
| 4,439,733 | 3/1984 | Hinshaw et al. | 324/322 |
| 4,780,677 | 10/1988 | Nissenson et al. | 324/322 |
| 4,825,162 | 4/1989 | Roemer et al. | 324/318 |
| 4,859,947 | 8/1989 | Boscamp | 324/318 |
| 4,885,541 | 12/1989 | Hayes | 324/322 |
| 4,924,868 | 5/1990 | Krause et al. | 128/653 |
| 4,975,644 | 12/1990 | Fox | 324/318 |
| 5,132,621 | 7/1992 | K'ng et al. | 324/322 |

FOREIGN PATENT DOCUMENTS

| | | |
|---|---|---|
| 374994 | 6/1990 | European Pat. Off. . |
| 0384770 | 8/1990 | European Pat. Off. . |
| 0390476 | 10/1990 | European Pat. Off. . |
| 0407579 | 1/1991 | European Pat. Off. . |

Primary Examiner—Michael J. Tokar
Attorney, Agent, or Firm—Limbach & Limbach

[57] ABSTRACT

In a multiple coil type magnetic resonance imaging system, MR signals can be obtained at high S/N ratio and over a large image region. The magnetic resonance imaging system includes: a plurality of receiving coils for receiving a plurality of MR signals generated from plural portions of an object under medical examination; a plurality of filters coupled to the plural receiving coils, for filtering the plurality of MR signals to obtain a plurality of filtered MR signals; a processor and a filter passband setting circuit for setting passbands of the plurality of filters in such a manner that the plurality of filtered MR signals have preselected frequency bands different from each other; and, an adder for adding the filtered MR signals with each other which are derived from the filters coupled to at least two receiving coils selected from the plurality of receiving coils.

18 Claims, 10 Drawing Sheets

MULTIPLE COIL TYPE MAGNETIC RESONANCE IMAGING SYSTEM INCLUDING FILTERS WITH DIFFERENT PASSBANDS

BACKGROUND OF THE INVENTION

1. Field of the Invention

The present invention relates to a magnetic resonance imaging system including a multicoil composed of a plurality of small receiving coils arranged nearby an object under medical examination to pick up magnetic resonance signals (referred to as MR signals, hereinafter) over a wide region of the object under medical examination, and more particularly to a magnetic resonance imaging system which can obtain MR signals of different frequency bands from MR signals picked up by the small receiving coils to improve the S/N ratio.

2. Description of the Prior Art

Figure 1:
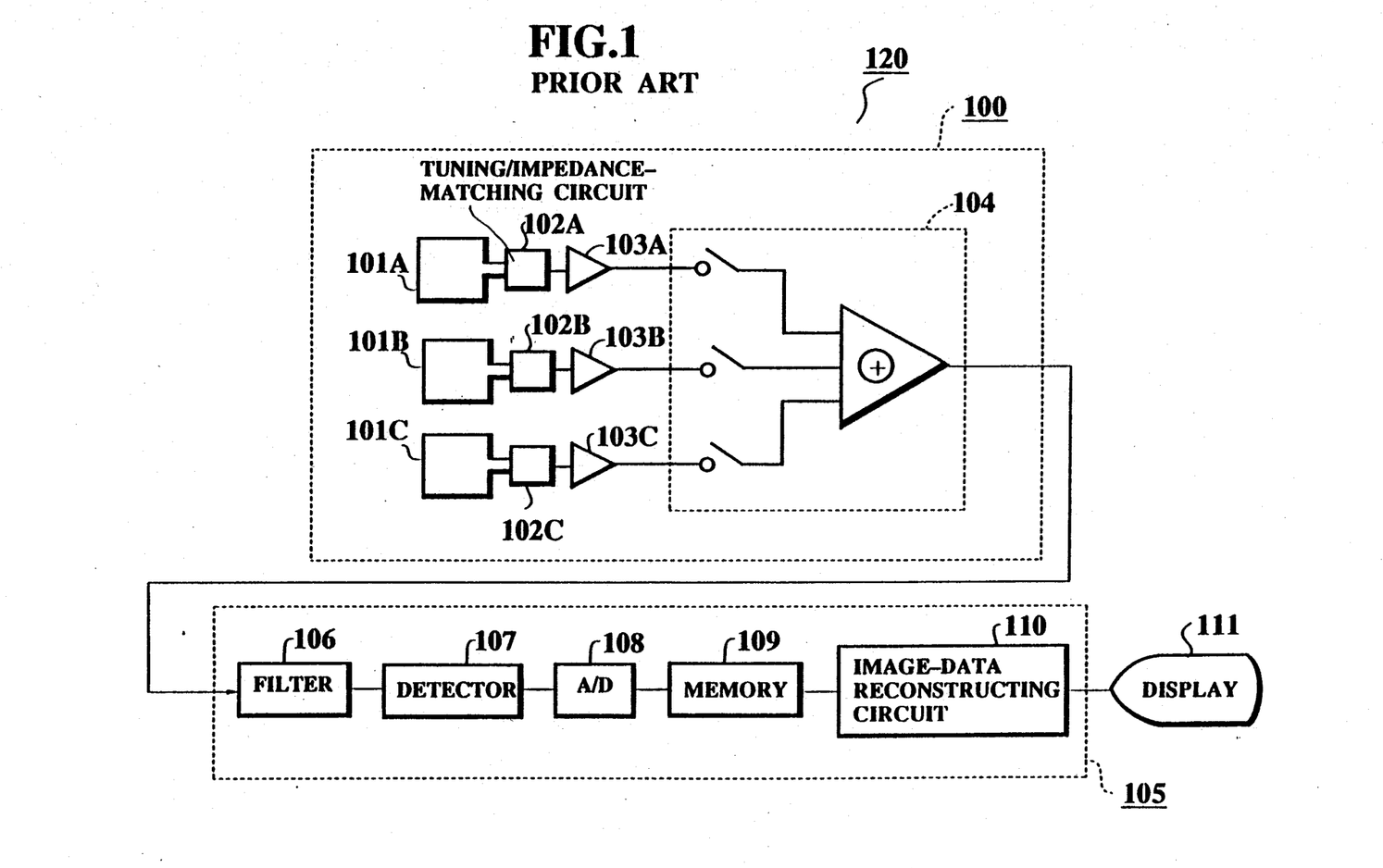
FIG. 1 is a block diagram showing a partial configuration of a prior-art magnetic resonance imaging system 120.

FIG. 1 is a block diagram showing a partial configuration of a prior-art magnetic resonance imaging system 120, in which a plurality of surface coils 101A to 101C are arranged as a multicoil. In the drawing, the system comprises roughly a probe assembly 100, a data processing unit 105, and a display unit 111. The probe assembly 100 includes a plurality of small receiving coils 101A to 101C arranged on the same plane to pick up MR signals generated from an MR signal source, that is, an object under medical examination (not shown); a plurality of tuning/impedance matching circuits 102A to 102C for tuning the picked up MR signals and matching impedances of the coils with those of the succeeding stage, respectively; a plurality of preamplifiers 103A to 103C for amplifying the output signals of the coils respectively; and an adder 104.

Each coil 101, circuit 102 and preamplifier 103 are connected in series, separately in this order. Therefore, MR signals outputted from the small receiving coils 101A to 101C are given to the adder 104 through the tuning/impedance matching circuits 102A to 102C and the preamplifiers 103A to 103C, respectively. The adder 104 selects the MR signal outputted from any desired single small receiving coil or adds the MR signals outputted from the plural small receiving coils, before transmitting the MR signals to the data processing unit 105.

In this case, when any one of the small receiving coils 101A to 101C is selected, the MR signals are picked up at a small MR image region of the object under medical examination through the selected single small receiving coil. On the other hand, when two or three small receiving coils are selected and combined in any given combination, the MR signals are picked up over a large MR image region of the object under medical examination through the plural combined small receiving coils equivalent to a large receiving coil obtained by connecting the outermost contours of the combined small receiving coils.

The data processing unit 105 includes a filter 106, a detector 107, an A/D converter 108, a memory 109, and an image reconstruction circuit 110. Therefore, MR signals within a predetermined frequency band can be obtained from the MR signals transmitted to the data processing unit 105 through the filter 106, picked up through the detector 107, converted into digital MR signals through the A/D converter 108, and then stored in the memory 109.

These stored MR signal data are given to the image reconstruction circuit 110 for Fourier transformation so that an image of the object to be examined can be reconstructed on the basis of these MR signal data. The reconstructed image data are then given to the display unit (e.g. CRT) 111 to display a predetermined cross-sectional image of the object under medical examination in response to the reconstructed MR image signals. The above-mentioned prior-art MR imaging system is disclosed in U.S. Pat. Nos. 4,825,162, 4,859,947 or 4,975,644, for instance, therefore these documents being incorporated by reference herein.

In general, when a large-sized receiving coil with a large sensitivity range is used to pick up MR signals over a large MR image region or over a voluminous image portion of an object under medical examination, since random noise generated from all over the sensible region of the object to be examined is also picked up by the receiving coils, there exists a problem in that the S/N ratio is reduced and therefore the reconstructed MR image is deteriorated in image quality.

In the case of the above-mentioned multicoil, when the MR signals outputted from a single small receiving coil is processed, the image obtained at a small MR image region is high in S/N ratio and image quality. However, when the MR signals outputted by plural small receiving coils are added by the adder 104 and then processed, although the MR image region (i.e. the visual field of MR image) increases, the image over a large MR image region is low in S/N ratio and image quality. This is because the effective sensitivity range of the receiving coil increases, with the result that the intensity of random noise received from an object under medical examination increase.

SUMMARY OF THE INVENTION

With these problems in mind, therefore, it is the object of the present invention to provide a magnetic resonance imaging system with a multicoil which can pick up MR signals over a large image region at high S/N ratio to obtain an MR image large in visual field and high in image quality.

To achieve the above-mentioned object, the present invention provides a magnetic resonance imaging system comprising:

a plurality of receiving coils (2-1:2-n for receiving a plurality of MR (magnetic resonance) signals generated from plural portions of an MR signal source (P);

a plurality of filters (6-1-6n) coupled to said plural receiving coils, for filtering said plurality of MR signals to obtain a plurality of filtered MR signals;

filter passband setting means (10:12) for setting passbands of said plurality of filters (6-1:6-n) in such a manner that said plurality of filtered MR signals have preselected frequency bands different from each other; and, adder means (7) for adding the filtered MR signals with each other which are derived from the filters (6-1:6-n) coupled to at least two receiving coils (2-1:2-n) selected from said plurality of receiving coils (2-1:2-n).

BRIEF DESCRIPTION OF THE DRAWINGS

The present invention may be best understood from the following detailed description taken in conjunction with the accompanying drawings, in which.

DETAILED DESCRIPTION OF THE PREFERRED EMBODIMENTS

Basic Idea

Before describing various preferred embodiments of the magnetic resonance imaging system according to the present invention, the basic idea of the invention will first be summarized hereinbelow.

In the magnetic resonance imaging system according to the present invention, a plurality of small receiving coils for picking up MR signals generated from an MR signal source (i.e. an object under medical examination) are arranged on the same plane. Further, a plurality of filters of bandpass type are connected one by one to the small receiving coils for filtering only MR signals at predetermined frequency bands, respectively from the MR signals outputted from the respective small receiving coils. An adder is connected to these filters to output MR coils. An adder is connected to these filters to output MR signals filtered through a single filter or plural filters corresponding to a single selected or plural selected small receiving coils.

In the above-mentioned imaging system, since MR signals of predetermined different frequency bands can be obtained from the MR signals outputted from the respective small receiving coils through the filters of bandpass type, the MR signals of frequency bands corresponding to high sensitivity ranges (at which the MR signals can be picked up by the respective small receiving coils at high sensitivity) can be picked up, while eliminating noise of other frequency bands.

Further, since the MR signals of frequency bands corresponding to the high sensitivity ranges of the respective small receiving coils and filtered through the respective filters are added with each other by the adder, MR signals over a large image region can be obtained. In the present invention, since the respective frequency bands corresponding to the high sensitivity ranges of the respective small receiving coils are different from each other, it is possible to minimize the sum total of noise levels of the respective small receiving coils even if the respective MR signals outputted through the respective filters are added. That is, since MR signals can be picked up at high S/N ratio and over a large image region, it is possible to obtain an image of broad visual field in high quality.

In addition, where a mixer is connected between each small receiving coil and each filter, since the frequency band of the high-frequency MR signals outputted from each small receiving coil can be transformed into low-frequency band signals, for instance through the mixer, it is possible to lower the operating frequency band of the filter and therefore to facilitate designing of a narrow passband filter, as compared with when designing a filter which operates within the frequency (Larmor frequency) band of the high-frequency MR signals and additionally have a passband much narrower than the Larmor frequency band.

First Embodiment

Figure 2:
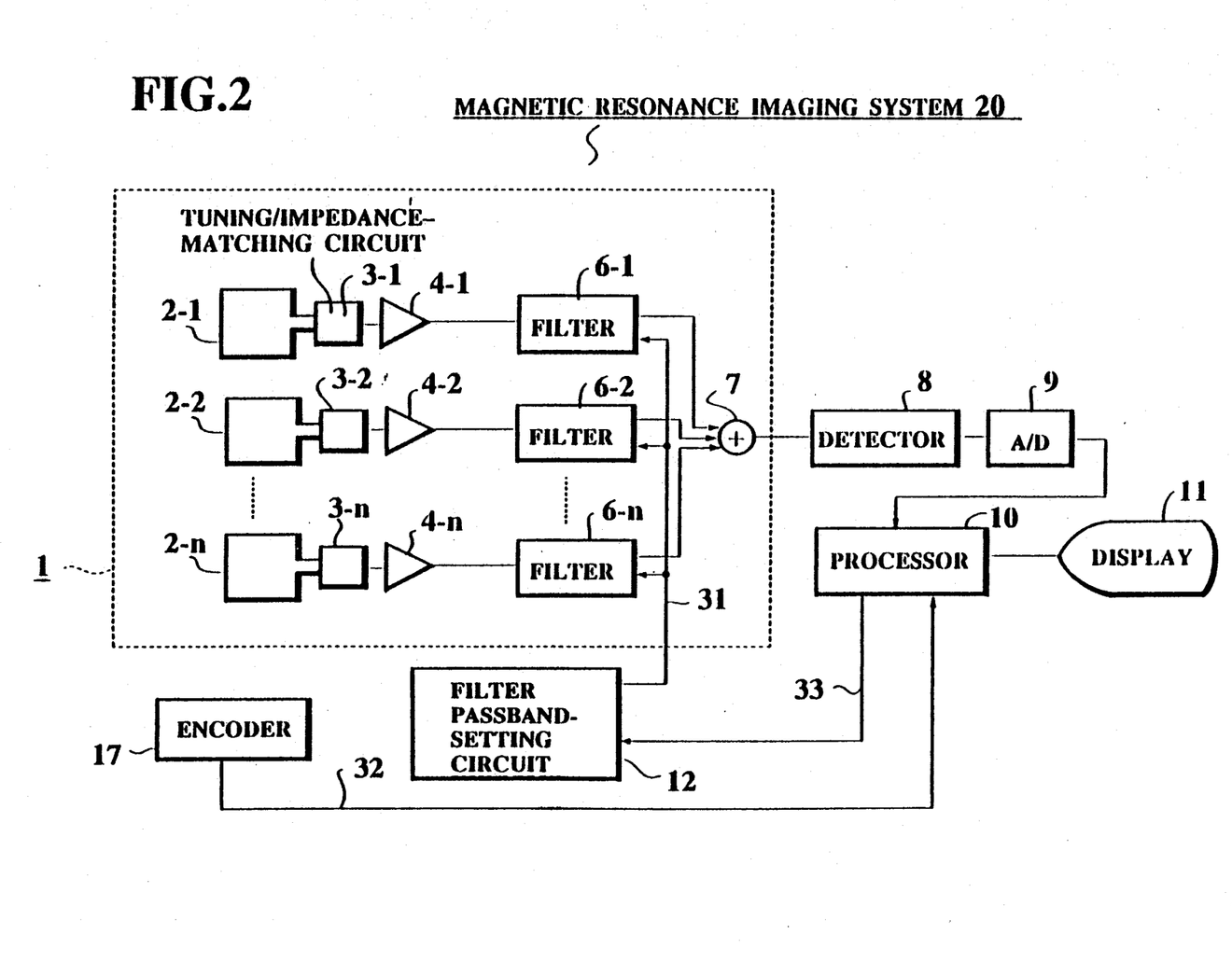
FIG. 2 is a block diagram showing a partial configuration of a first embodiment of the magnetic resonance imaging system 20 according to the present invention.

FIG. 2 is a block diagram showing a partial configuration of the first embodiment of the magnetic resonance imaging system 20 according to the present invention. In the drawing, a plurality of small receiving coils 2-1 to 2-n for picking up MR signals generated from an object under medical examination (i.e. a MR signal source) are provided on the same plane as a surface coil within a receiving unit 1 of the imaging system 20.

There are connected in series one of the small receiving coils 2-1 to 2-n, one of tuning/impedance matching circuits 3-1 to 3-n for each tuning MR signals and matching impedance of the receiving coil with that of the succeeding stage, one of preamplifiers 4-1 to 4-n for each amplifying the MR signals outputted from the receiving coils, and one of bandpass filters 6-1 to 6-n for each filtering MR signals of a predetermined frequency band from the MR signals outputted from one of the preamplifiers 4-1 to 4-n. The passbands of these filters 6-1 to 6-n are different from each other, and the passband characteristics of each filter is programmable.

Further, an adder 7 is connected to these filters 6-1 to 6-n so as to transmit outputted from a single or plural filters selected from among the filters 6-1 to 6-n. In other words, MR signals outputted through a single or plural filters corresponding to a single or plural coils selected from among the small receiving coils 2-1 to 2-n can be obtained through the adder 7.

When an image of an object under medical examination is picked up, a uniform static magnetic field generated by a magnet (not shown), a gradient magnetic field generated by a gradient magnetic field coil (not shown) and a high-frequency magnetic field generated by a transmitting unit (not shown) are simultaneously applied to an object under medical examination. MR signals generated from the object to be examined after the object has been released from the high-frequency magnetic field are picked up by the small receiving coils 2-1 to 2-n of the receiving unit 1.

The high frequency MR signals picked up by the respective small receiving coils 2-1 to 2-n are transmitted to the respective filters 6-1 to 6-n via the respective tuning/impedance matching circuits 3-1 to 3-n and the respective preamplifiers 4-1 to 4-n. The filters 6-1 to 6-n filter MR signals of frequency bands corresponding to the high sensitivity ranges of the respective small receiving coils 2-1 to 2-n, respectively, from the MR signals from the preamplifiers 4-1 to 4-n.

The adder 7 selects the MR signals outputted through only a single filter or adds the MR signals outputted through plural filters selected from among the filters 6-1 to 6-n, before transmitting the MR signals to a detector 8. After having been demodulated through the detector 8, the MR signals are converted into digital MR signal data via the A/D converter 9 and then given to a processor 10. The processor 10 processes the digital MR signal data in accordance with Fourier transformation, for instance to reconstruct an image of the object under medical examination on the basis of these data. The image signals thus reconstructed are transmitted from the processor 10 to a display unit 11 (e.g. CRT) to display a predetermined cross-sectional image of the object to be examined on the basis of these MR image data.

Further, the processor 10 gives respective passband information data for the respective passbands, to a filter band setting circuit 12. In accordance with the given passband information data, the filter band setting circuit 12 sets the respective passbands of the programmable filters 6-1 to 6-n. The method of setting these filter passbands will be described later in further detail.

Reason of Increase of Noise from Multicoil

Prior to the description of the operation and the function of the magnetic resonance imaging system 20 according to the first embodiment, the reason why noise increases in a magnetic resonance imaging system including a multicoil will be explained hereinbelow.

Figure 3:
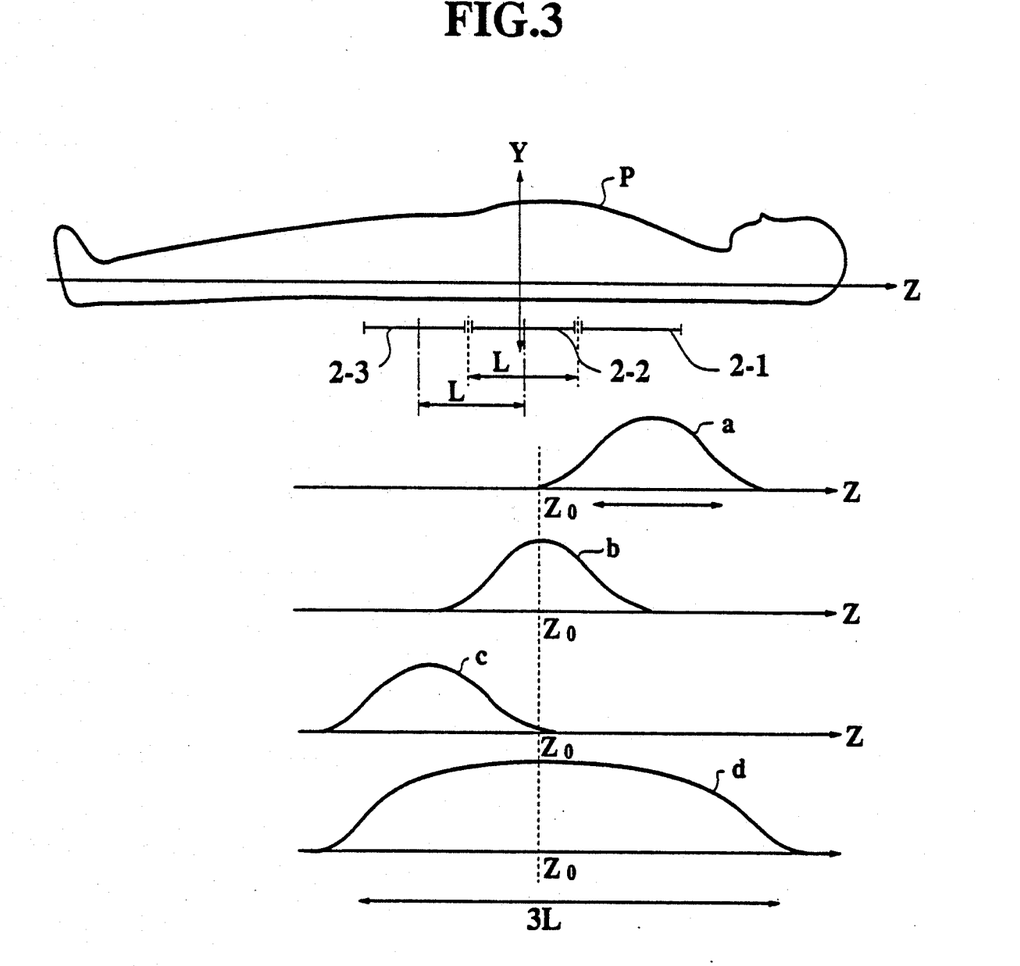
FIG. 3 is an illustration for assistance in explaining the sensitivity distribution of the small receiving coils 2-1 to 2-3 of the system 20 shown in FIG. 2.

The above-mentioned plural small receiving coils 2-1 to 2-n have different sensitivity distributions, respectively. When a sagittal image of the lumbar spine or thoracic spine of a human body (i.e. an object under medical examination) is required to obtain, the three small receiving coils 2-1 to 2-3, for instance are arranged near and along the Z-axis (longitudinal direction) of the human body P as shown in FIG. 3. Under these conditions, the sensitivity distributions of the small receiving coils 2-1 to 2-3 at a Y-axis position of the object P under medical examination with respect to the Z-axis direction become as shown by curves a to c in FIG. 3, where $Z_o$ denotes a central Z-axis position of the small receiving coil 2-2, and L denotes a distance between two adjacent centers of the for instance two small receiving coils 2-2 and 2-3 which is roughly equal to a length L of each small receiving coil. When these sensitivity distributions of these receiving coils 2-1 to 2-3 are added, the whole sensitivity distribution becomes as shown by a curve d in FIG. 3, which is equivalent to that obtained by a single coil with a length 3L in the Z-axis direction.

Figure 4:
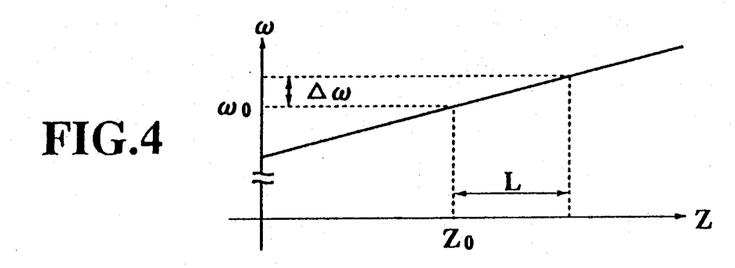
FIG. 4 is a graphical representation showing the relationship between the Larmor frequency ω and the Z coordinates in the same embodiment.

Here, spin echo or gradient echo technique is well known as the method of picking up MR signals from an object P under medical examination. Although not being limited to a specific technique, in general after slicing (i.e. a cross-sectional MR image has been selected), a gradient magnetic field with respect to the Z-axis direction is applied to the object P so that the Larmor frequency differs along the Z-axis. That is, FIG. 4 shows the relationship between the Z-axis and the Larmor frequency $\omega$ obtained when a gradient magnetic field is applied with the central position $Z_o$ as its center. FIG. 4 indicates that the Larmor frequency $\omega_o$ can be obtained at the central position $Z_o$ by the major magnetic field, and the Larmor frequency is offset by $\Delta\omega$ when the length is offset by L in the Z-axis direction.

FIGS. 5A to 5D show the relationship between the output signal level and the Larmor frequency $\omega$ of each small receiving coil 2-1 to 2-3, respectively, in which the ordinate indicates the magnitude (e.g. power level) per unit frequency width of the signal outputted from each coil. In FIG. 5, therefore, the curves a' to c' denote power levels of the MR signals picked up by the small receiving coils 2-1 to 2-3, respectively. FIG. 5 indicates that if the object P distributes uniformly in the Z-axis direction, these curves a' to c' are considerably similar in shape to the sensitivity curves a to c shown in FIG. 3.

Figure 5A:
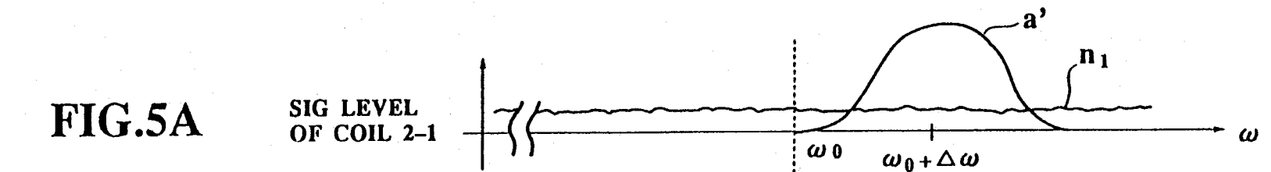
FIGS. 5A to 5D are graphical representations showing the relationship between the Larmor frequencies and the signal levels of the small receiving coils 2-1 to 2-3, respectively, for assistance in explaining the reason why noise level increases when the signal levels of the small receiving coils are simply added.
Figure 5B:
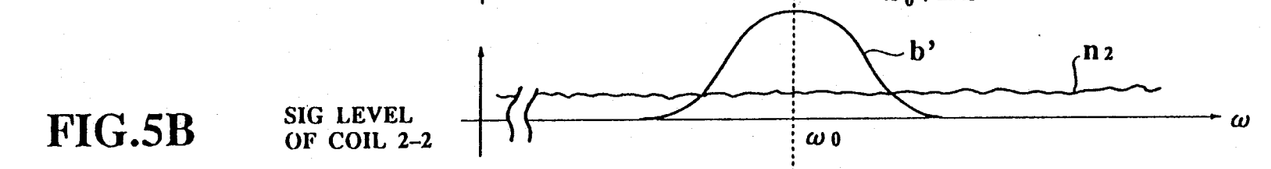
Figures 5C, 5D:
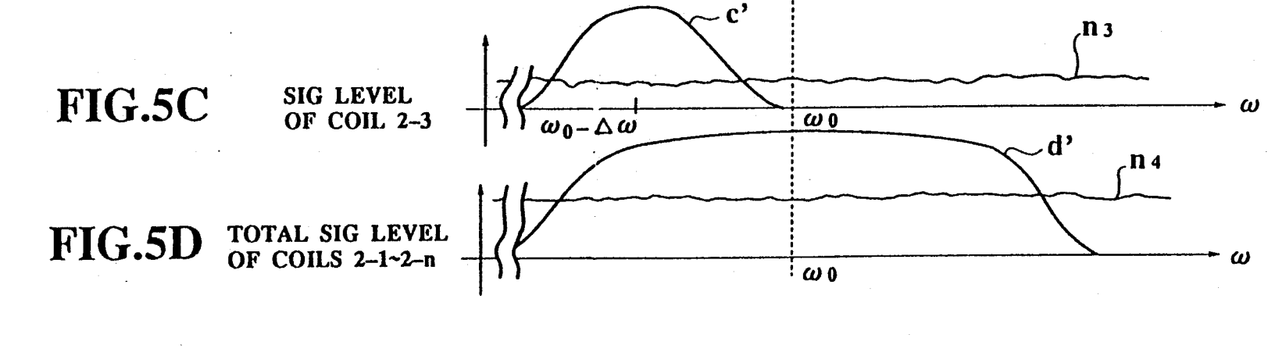

Each small receiving coil 2-1 to 2-3 receives also random noise generated at all the frequency bands in addition to the MR signals. In FIGS. 5A to 5D, the power levels of random noise are shown as the lines $n_1$ to $n_4$, respectively. It is possible to simply add the signals outputted from the small receiving coils 2-1 to 2-3, so that the MR signal d' as shown in FIG. 5D can be obtained over a region 3L three times wider than the Z-axis directional length L of each receiving coil 2-1 to 2-3, that is, with a frequency range three times broader than that of each receiving coil 2-1 to 2-3. In this case, however, since the noise power level $n_4$ also increases about three times higher than each noise level $n_1$ to $n_3$, thus reducing the S/N ratio markedly.

Cutting of Noise

In order to prevent noise from being increased, in the present embodiment, MR signals of frequency bands corresponding to the respective high sensitivity ranges of the respective small receiving coils 2-1 to 2-n are filtered from the MR signals picked up by the respective small receiving coils 2-1 to 2-n, by means of the passband-type filters 6-1 to 6-n, and noise of frequency bands other than the above is eliminated. This method of eliminating noise will be described hereinbelow.

Figure 6:
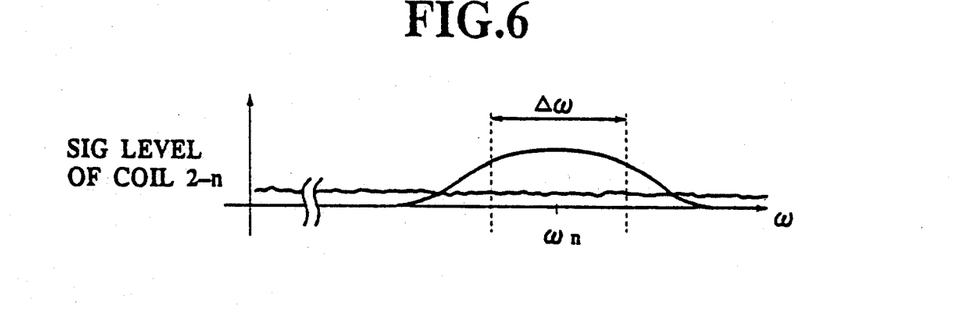
FIG. 6 is a graphical representation showing the signal level of the small receiving coil 2-n in the same embodiment.
Figure 7:
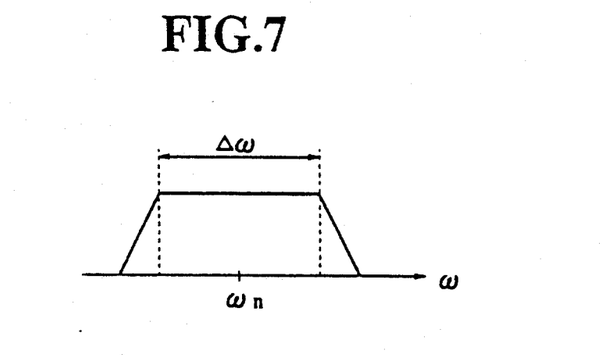
FIG. 7 is a graphical representation showing the passband characteristics of the filter 6-n of the same embodiment.
Figure 8:
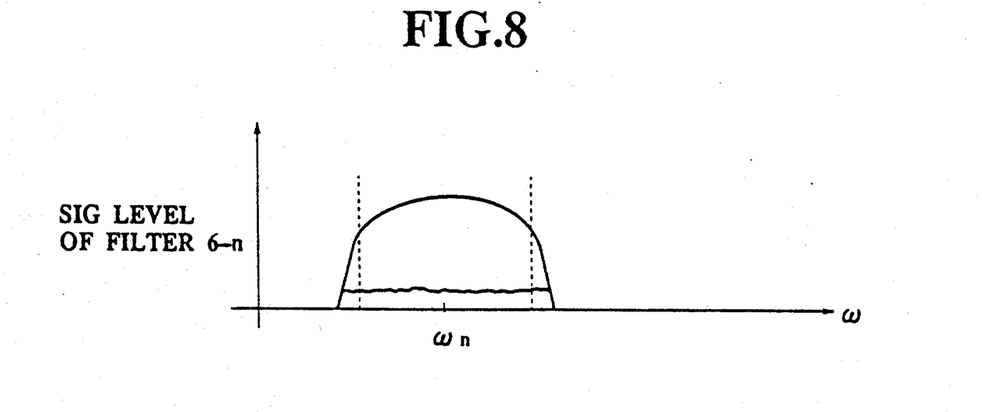
FIG. 8 is a graphical representation showing the signal level of the filter 6-n in the same embodiment.

As already described, the passbands of the filters 6-1 to 6-n are adjustable and further determined so as to be roughly equal to the frequency bands corresponding to the high sensitivity ranges of the respective small receiving coils 2-1 to 2-n in response to passband setting signals 31 given from the filter band setting circuit 12 to the respective filters 6-1 to 6-n. For example, when the output of the small receiving coil 2-n is as shown in FIG. 6, the passband of the filter 6-n is determined so as to become roughly from $(\omega n - \Delta\omega/2)$ to $(\omega n + \Delta\omega/2)$. FIG. 7 shows an example of the passband characteristics of the filter 6-n under these conditions. Therefore, MR signals of a frequency band roughly from $(\omega n - \Delta\omega/2)$ to $(\omega n + \Delta\omega/2)$ can be outputted from the filter 6-n, as shown in FIG. 8. In other words, it is possible to eliminate noise of frequency band other than the above frequency band from the MR signals outputted from the small receiving coil 2-n.

With respect to the other small receiving coils 2-1 to 2-(n−1), similarly MR signals of the frequency bands corresponding to the high sensitivity regions of the respective small receiving coils 2-1 to 2-(n−1) can be outputted through the respective filters 6-1 to 6-(n−1), from the MR signals picked up by the respective small receiving coils 2-1 to 2-(n−1), while eliminating noise of frequency bands other than the above.

Further, frequency passbands are set to the respective filters 6-1 to 6-(n−1) in such a way as to have a width $\Delta\omega$ with the respective Larmor frequencies $\omega_1$ to $\omega_{n-1}$ as the respective centers at the central positions of the respective small receiving coils 2-1 to 2-(n−1), in the same way as with the case of the filter 6-n. Here, the method of setting the passbands of the filters 6-1 to 6-n will be described in further detail hereinbelow.

Figure 12:
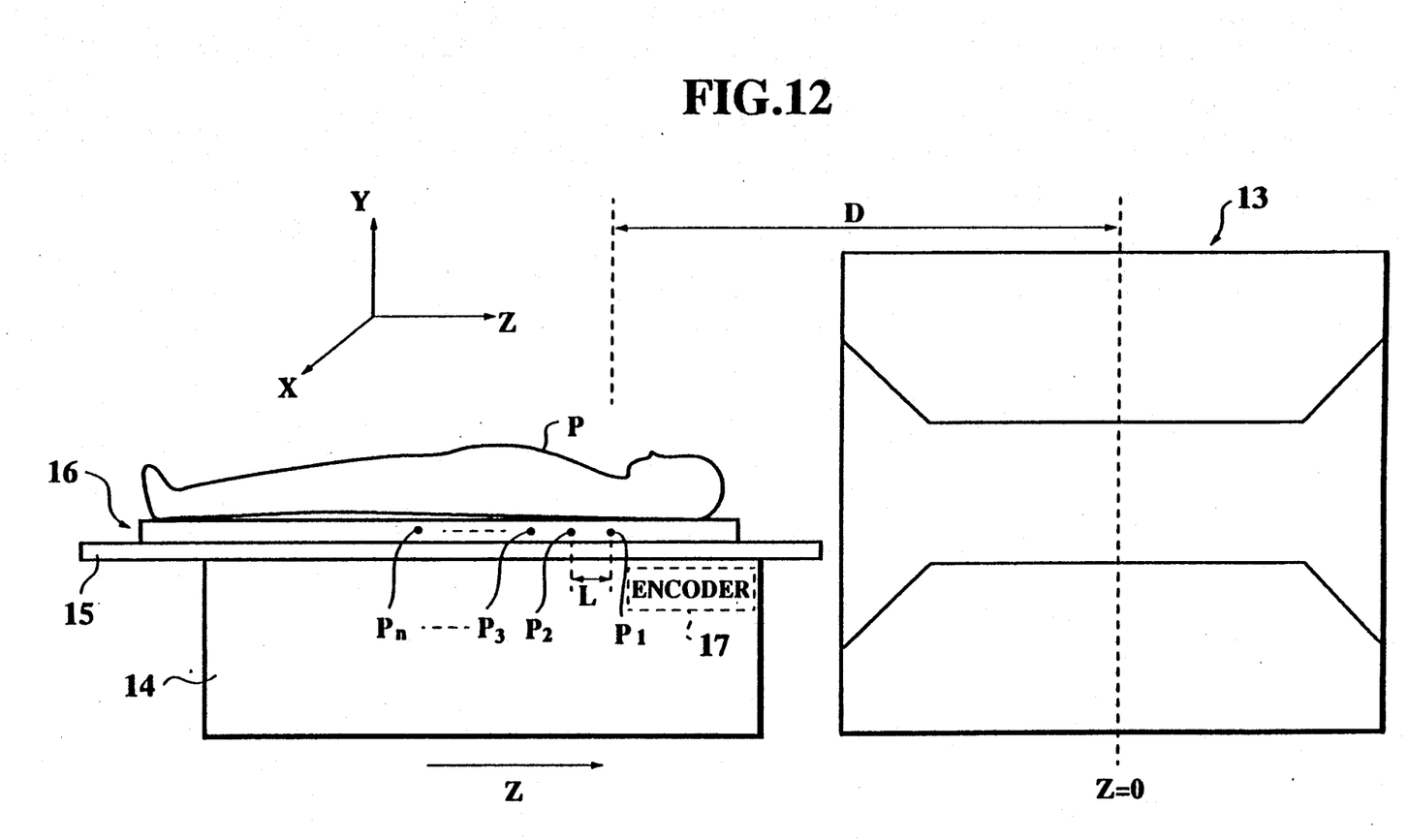
FIG. 12 is an illustration showing the positional relationship between the small receiving coils 2-1 to 2-n and the frame 13 in the same embodiment.

First, the processor 10 calculates a differential value $\Delta\omega$ between the Larmor frequencies $\omega_1$ to $\omega_n$ at the central positions of the respective small receiving coils and the Larmor frequency corresponding to the pitch of the small receiving coils as follows:

FIG. 12 shows the positional relationship between various elements related to the frequencies $\omega_1$ to $\omega_n$ and $\Delta\omega$. A magnet (not shown) is mounted in a frame 13. The region in which the magnetic field distribution is most uniform is suitable for imaging an object to the examined. Therefore, the central position of the most preferable region is determined as $Z=0$. A bed 14 is fixed to the frame 13. A top plate 15 on the bed 14 is movable in the Z-axis direction. A coil assembly 16 is arranged on the top plate 15, and the object P under medical examination is placed on the coil assembly 16. The X-Y-Z coordinates are determined as shown in FIG. 12. The coil assembly 16 is fixed on the top plate 15 by various appropriate means such as pins, screws, convex and concave engagement, etc. In the coil assembly 16, there are arranged the small receiving coils 2-1 to 2-n, the tuning/impedance matching circuits 3-1 to 3-n, and the preamplifiers 4-1 to 4-n, respectively. However, the filters 6-1 to 6-n and the adder 7 are not necessarily mounted in the coil assembly 16.

In FIG. 12, points $P_1$ to $P_n$ denote the respective central positions of the small receiving coils 2-1 to 2-n, and a distance L denotes an interval between the two adjoining coil central positions $P_1$ to $P_n$. At the initial position of the top plate 15, the central position $P_1$ of the small receiving coil 2-1 is located a distance D away from the central position of the frame 13. Therefore, when the top plate 15 is fed into the frame 13 by a distance T from the initial position, this distance T is sensed by an encoder 17 mounted on the bed 14, and a sensor signal 32 is given from the encoder 17 to the processor 10 as shown in FIG. 2, so that the processor 10 can recognize this distance T.

On the other hand, in taking an MR image, the magnetic field intensity B (obtained when a gradient magnetic field $G_z$ is applied in the Z-axis direction) can be calculated by the formula as $$B = G_z Z + B_o$$

where $B_o$ denotes the static magnetic field intensity; Z denotes the Z coordinate position. The intensity of this $G_z$ is previously known by the processor 10, since the control signal from the processor 10 to the power supply (not shown) for gradient coil (not shown) is only one variable to determine $G_z$. Further, the magnetic field $B_1$ at the central position $P_1$ of the small receiving coil 2-1 can be calculated as $$B_1 = G_z(T-D) + B_o$$

Therefore, the Larmor frequency $\omega_1$ at the central position $P_1$ can be obtained as follows:

$$\omega_1 = \gamma(G_z(T-D) + B_o)$$

where $\gamma$ denotes a physical constant (referred to as magnetogyric rotatory ratio). The Larmor frequency $\omega_2$ at the central position $P_2$ of the small receiving coil 2-2 can be expressed as $$\omega_2 = \gamma(G_z(T-D-L) + B_o)$$

Similarly, the Larmor frequency $\omega_n$ at the central position $P_n$ of the small receiving coil 2-n can be calculated in accordance with the following formula:

$$\omega_n = \gamma(G_z(T-D-(n-1)L) + B_o)$$

Further, the differential value $\Delta\omega$ of the Larmor frequency is $$\Delta\omega = \gamma \cdot G_z L$$

Figures 13, 14:
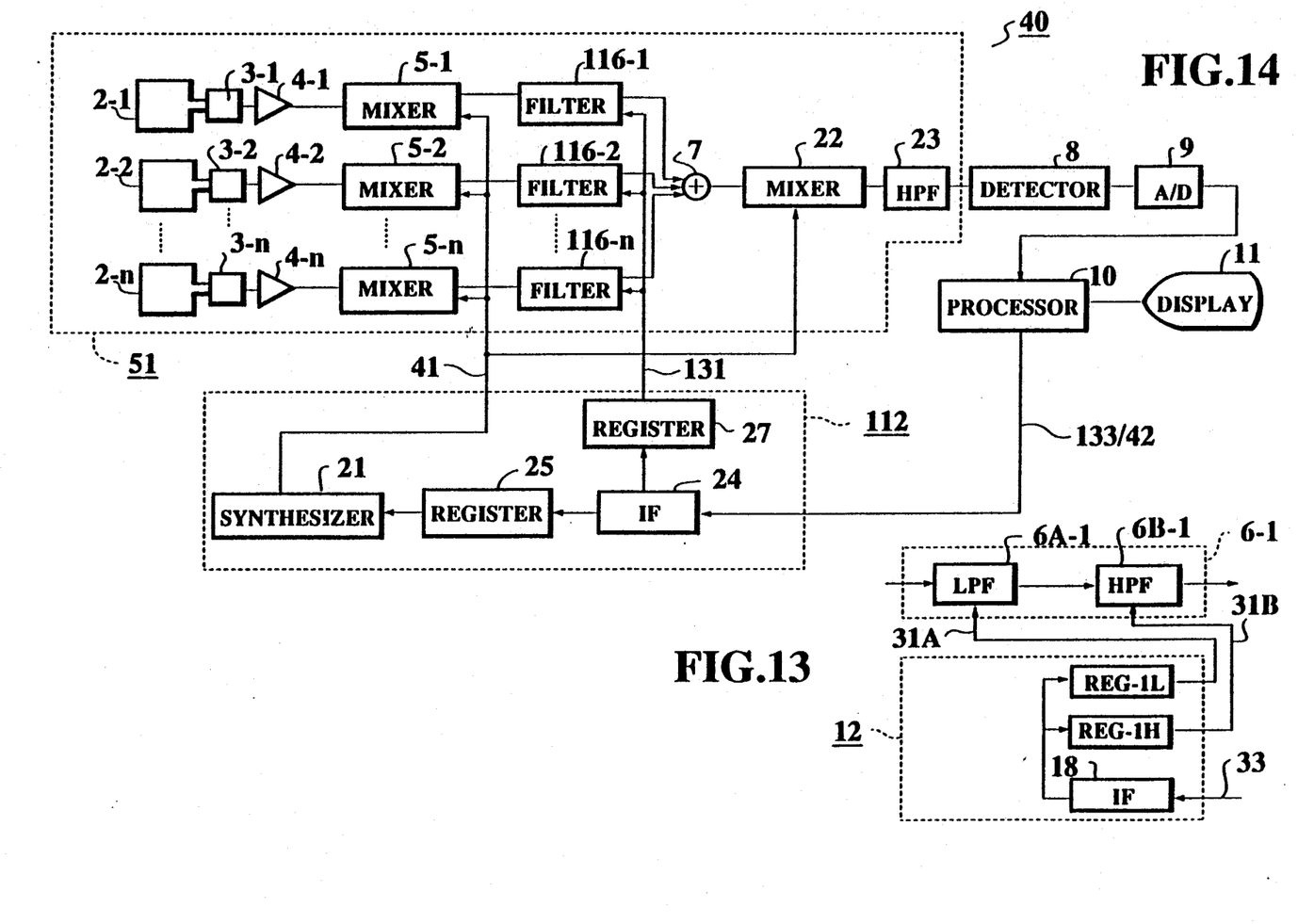
FIG. 13 is a block diagram showing the internal configuration of the filter 6-1 and the filter band setting circuit 12 in the same embodiment.
FIG. 14 is a block diagram showing a partial configuration of a second embodiment of the magnetic resonance imaging system 40 according to the present invention.

FIG. 13 is a block diagram showing the internal configuration of the filter 6-1 and the filter passband setting circuit 12. In determining the passband of the filter 6-1, the processor 10 determines the passband lower and upper limits of the filter 6-1 on the basis of the Larmor frequency $\omega_1$ and $\Delta\omega$ as follows:

$$\omega_{1L} = \omega_1 - \Delta\omega/2$$

$$\omega_{1H} = \omega_1 + \Delta\omega/2$$

The determined limit information data $\omega_{1L}$ and $\omega_{1H}$ are transmitted to the registers REG-1H and REG-1L via an interface 18 as passband information signals 33 and then stored therein as passband data. The register REG-1L supplies the passband control signal (digital signal) 31A corresponding to the data $\omega_{1H}$ to the programmable low-pass filter 6A-1; and the register REG-1H supplies the passband control signal (digital signal) 31B corresponding to the data $W_{1L}$ to the programmable high-pass filter 6B-1. Therefore, the passband upper limit $\omega_{1H}$ of the LPF 6A-1 is determined by the passband control signal 31A and the passband lower limit $\omega_{1L}$ of the HPF 6B-1 is determined by the passband control signal 31B, so that the passband between $\omega_{1L}$ and $\omega_{1H}$ of the filter 6-1, that is, the frequency range can be determined so as to correspond to the high sensitivity range of the small receiving coil 2-1.

Addition of Filter Outputs

Figure 9:
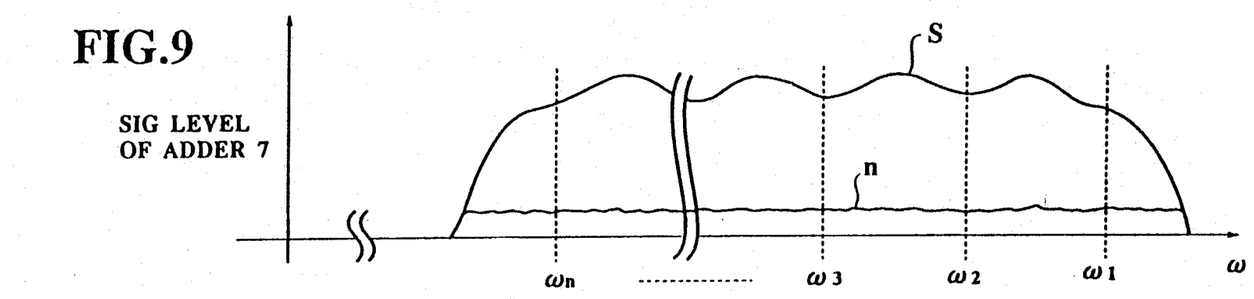
FIG. 9 is a graphical representation showing the signal level of the adder 7 of the same embodiment, in which signals outputted from all the small receiving coils 2-1 to 2-n are added.

All the output signals of the filters 6-1 to 6-n are added by the adder 7. Here, the output of the adder 7 as shown in FIG. 9 can be obtained in the case where the bandpass width of each of the filters 6-1 to 6-n is selected as roughly $\Delta\omega$ as shown in FIG. 7. In FIG. 9, the level of noise n is roughly equal to that included in the MR signals picked up by a single small receiving coil, so that it is possible to minimize the noise level, as compared with the case where no filters 6-1 to 6-n are provided as shown in FIG. 5D. Further, in FIG. 9, the signal level of the MR signal S drops at frequency bands corresponding to those other than the boundaries between two adjacent high sensitivity ranges of the respective small receiving coils 2-1 to 2-n. However, since this drop phenomenon in the signal level is predictable and therefore reproducible, it is possible to readily correct these drops in power level with respect to the Larmor frequency by executing sensitivity correction processing for the final image, for instance.

Figures 10, 11:
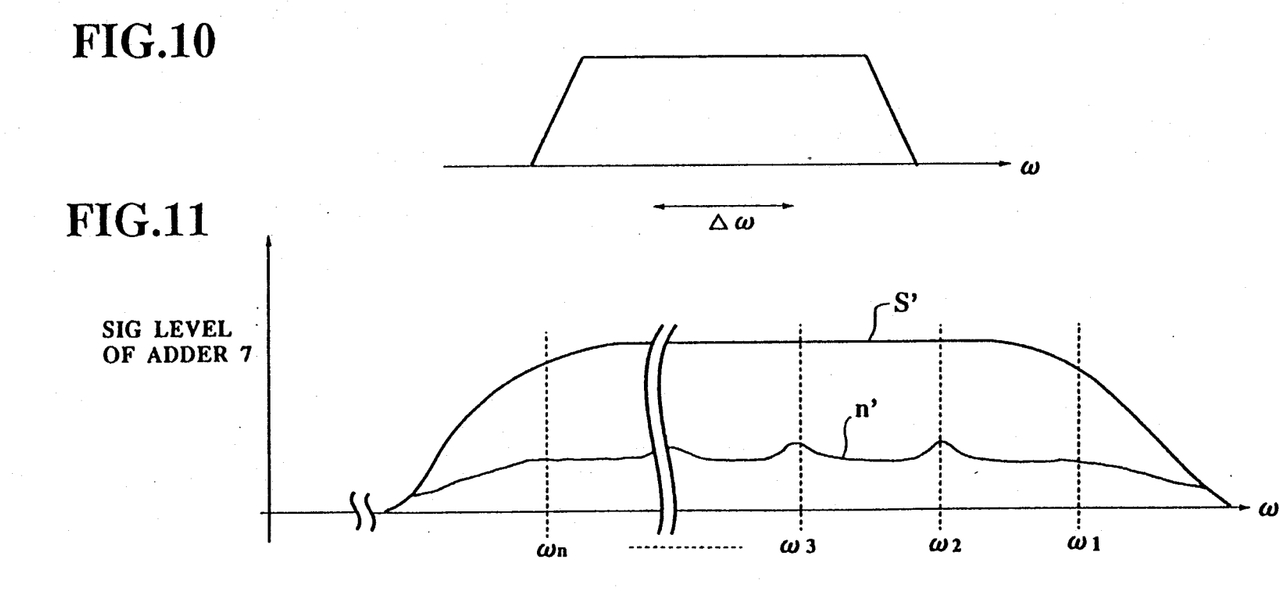
FIG. 10 is a graphical representations showing passband characteristics of the filters 6-1 to 6-n of the same embodiment.
FIG. 11 is a graphical representation showing the sum total of the signal levels of the filters 6-1 to 6-n.

The passband characteristics of the filters 6-1 to 6-n can be modified in various ways by changing the rising and/or falling edges of the passband characteristics, without being limited to only those shown in FIG. 7, as far as the sensitivity profile obtained by connecting all the outputs of the coils is not excessively distorted. For instance, where the bandpass widths of the filters 6-1 to 6-n are much wider than $\Delta\omega$, respectively as shown in FIG. 10, the sum total of the signal levels of the filters 6-1 to 6-n can be represented as shown in FIG. 11, in which S' denotes the MR signal level and n' denotes the noise level. In this case, since the passband of the filters 6-1 to 6-n are overlapped with each other, although noise n' increases non-uniformly, noise level can be reduced as compared with when no filters 6-1 to 6-n are provided. Further, the distribution of the signal S' can be made flat.

Here, when a single small receiving coil is selected from the small receiving coils 2-1 to 2-n, and the MR signals outputted form the single small receiving coil are outputted by the adder 7 via the filter corresponding to the small receiving coil, it is possible to pick up the MR signal at a small image region at high S/N ratio and therefore to obtain an image in a narrow visual field and a high image quality. Further, when the MR signals outputted from a plurality of small receiving coils are transmitted to the adder 7 via the filters corresponding to the respective small receiving coils, and the add 7 adds these filtered MR signals, it is possible to pick up the MR signals at a large image region at high S/N ratio and therefore to also obtain an image in a wide field and a high image quality. Since any required image region can be selected easily by switching the inputs of the adder 7 without changing the locations of the receiving coils relative to the object P under medical examination, it is possible to improve the easiness of system operation and the easiness of patient handling.

In the prior-art system, the data acquisition process of the same region is repeated for several times and MR signals obtained in this manner are added and averaged to increase the S/N ratio or to increase the image quality. In the system according to the present invention, however, since a relatively large region can be imaged at high S/N ratio, it is possible to obtain image data at various image regions at high speed, without increasing the number of additions and averages.

Further, in the above embodiment, when certain switches are provided between the small receiving coils 2-1 to 2-n and the input terminals of the adder 7, respectively, it is possible to more securely turn off MR signals outputted from the unnecessary receiving coils.

Second Embodiment

FIG. 14 is a block diagram showing a partial configuration of a second embodiment of the magnetic resonance imaging system 40 according to the present invention, in which the same references shown in FIG. 2 have been retained for similar elements having the same functions, without repeating the description thereof. Only the elements different from those shown in FIG. 2 will be described hereinbelow.

Mixers 5-1 to 5-n transform the respective output frequencies of the preamplifiers 4-1 to 4-n into different frequencies, respectively. To these mixers 5-1 to 5-n, a reference signal 41 indicative of a reference frequency $\omega_r$ (as described later) is applied from a synthesize 21 of a filter control circuit 112. Each of the mixers 5-1 to 5-n outputs a first signal with a frequency obtained by adding the reference frequency $\omega_r$ to each frequency of each output of the preamplifiers 4-1 to 4-n and a second signal with a frequency obtained by subtracting the reference frequency $\omega_r$ from each frequency thereof, in response to the reference signal 41. In this embodiment, only the second signals are transmitted.

Figure 15:
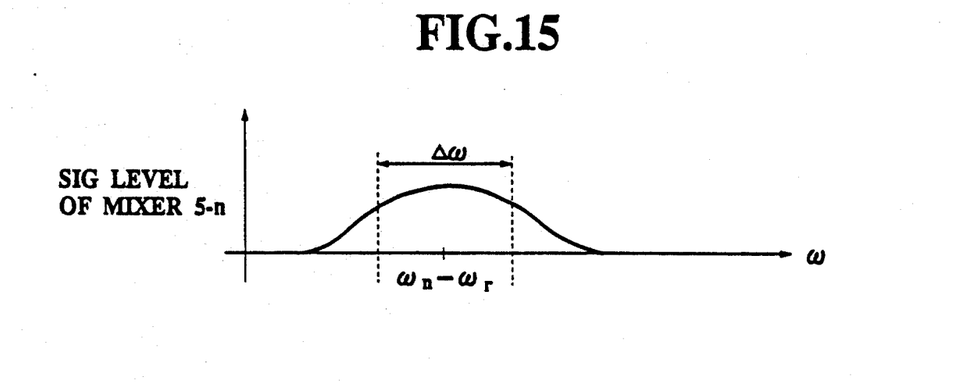
FIG. 15 is a graphical representation showing the output of the mixer 5-n of the same embodiment.

FIG. 15 shows the frequency distribution of the second signal outputted form the mixer 5-n together with that of noise, by way of example.

The frequency passbands of the filters 116-1 to 116-n are lowered by $\omega_r$ as compared with these frequency passbands of the filters 6-1 to 6-n of the first embodiment. However, the passband widths of these filters are the same as in the first embodiment. Therefore, since the frequencies of the first signals outputted from the respective mixers 5-1 to 5-n are out of the passbands of the filters 116-1 to 116-n, the first signals are eliminated by the filters 116-1 to 116-n, and only the second signals outputted from the respective mixers can pass through the respective filters 116-1 to 116-n.

In the second embodiment, when the reference frequency $\omega_r$ is determined to be close to the Larmor frequency, since the operating frequency bands of the filters 116-1 to 116-n are not markedly different from the passband width, the filters 116-1 to 116-n can be designed very easily. Additionally, in the second embodiment, since the MR signals of the high Larmor frequency band are transformed into signals of low frequency band through the mixers 5-1 to 5-n, it is possible to use relatively low-costly low-frequency filters as the filter 116-1 to 116-n.

Another mixer 22 serves to return the low-frequency output signals of the adder 7 to the original high frequency signals. Since the reference signal 41 is also supplied to this mixer 22, the mixer 22 outputs a first signal with a frequency obtained by adding the reference frequency $\omega_r$ to the output frequency of the adder 7 and a second signals with a frequency obtained by adding the reference frequency $\omega_r$ to the output frequency of the adder 7 and a second signal with a frequency obtained by subtracting $\omega_r$ therefrom, both the signals being applied to a high-pass filter 23. However, only the first signal of the output signals from the mixer 22 passes through the high-pass filter 23 to eliminate the second signal.

In this second embodiment, where the mixer 22 and the high-pass filter 23 are not both provided, since the frequency band of the output signals of the receiving unit 51 of the second embodiment is quite different from that of the output signals of the ordinary receiving coil, another different detector (a detector different from that used for the ordinary receiving coil) must be prepared. In the second embodiment, however, since the mixer 22 and the high-pass filter 23 are provided, it is possible to use the detector for the ordinary receiving coil as a detector 8 of the second embodiment. Further, if the detector 8 has functions to eliminate signals of frequency bands quite different from the Larmor frequency bands, the high-pass filter 23 is not necessary to be provided.

The operation of the processor 10 and a filter group control circuit 112 will be described hereinbelow. The processor 10 first sets the reference frequency $\omega_r$, transmits a reference frequency information signal 42 corresponding to the reference frequency $\omega_r$ to the register 25 via the interface 24, and stores it in the register 25 as a reference frequency data.

The reference frequency $\omega_r$ can be truly selected to any given value suitable for the whole system. However, in this embodiment, it is preferred to select the reference frequency $\omega_r$ a little lower than the Larmor frequency. The synthesizer 21 outputs a reference signal 41 of the reference frequency $\omega_r$ stored in the register 25 to the respective mixers 5-1 to 5-n.

On the other hand, the processor 10 determines the lower and upper limits of the passbands of the respective filters 116-1 to 116-n as described later, transmits the passband information signals 133 to the register 27 via the interface 24, and stores them as passband data. Further, in FIG. 14, although only a single register 27 is shown for simplification, in practice a necessary number of registers 27 are required to store the respective passband lower and upper limit data for the respective filters 116-1 to 116-n. These filters 116-1 to 116-n are of programmable bandpass type in the same way as the filters 6-1 to 6-n. The register 27 supplies passband control signals 131 corresponding to the data representative of the passband lower and upper limits of the respective filters 116-1 to 116-n, to the filters 161-1 to 116-n to determine the respective passbands of the respective filters 116-1 to 116-n.

In determining the passbands of the respective filters 116-1 to 116-n, the processor 10 determines the passband lower and upper limits of the filter 116-1, for instance as follows:

$$\omega_{21L} = \omega_{21} - (\Delta\omega/2) \cdot K - \omega_r$$

$$\omega_{21H} = \omega_{21} + (\Delta\omega/2) \cdot K - \omega_r$$

where $$\omega_{21} = \omega_1 = \gamma(G_z(T-D)+B_o)$$

$$\Delta\omega = \gamma \cdot G_z \cdot L$$

$K$ = a constant

If an extremely high noise elimination effect is required, K is set to approximately 1. However, if flat sensitivity distribution characteristics are required at the sacrifice of the noise elimination effect, K is set to a value of more than 1, as already explained with respect to the first embodiment. The same is applicable to other filters 116-1 to 116-n. That is, the passband lower and upper limits of the filter 116-2 are determined as $$\omega_{22L} = \omega_{22} - \omega_r - (\Delta\omega/2)K$$

$$\omega_{22H} = \omega_{22} - \omega_r + (\Delta\omega/2)K$$

$$\omega_{22} = \omega_2 = \gamma(G_z(T-D-L)+B_o)$$

The passband lower and upper limits of the other filters 116-3 to 116-n can be determined in the same way being offset $\gamma \cdot G_z \cdot L$ by $\gamma \cdot G_z \cdot L$.

Other Embodiments

Figure 16:
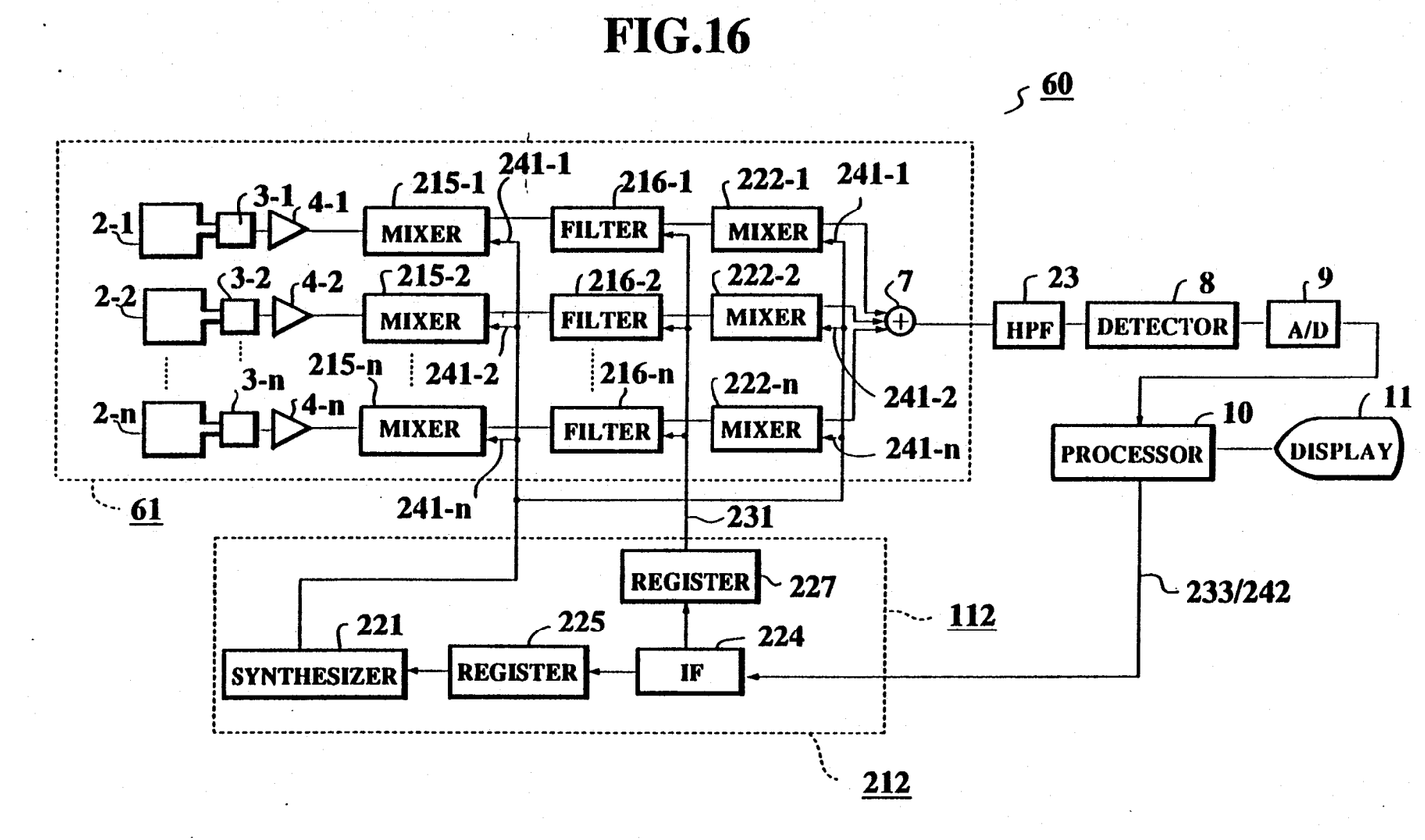
FIG. 16 is a block diagram showing a partial configuration of a third embodiment of the magnetic resonance imaging system 60 according to the present invention.

FIG. 16 is a block diagram showing a partial configuration of a third embodiment of the magnetic resonance imaging system 60 according to the present invention, in which the same references shown in FIG. 14 have been retained for similar elements having the same functions, without repeating the description thereof. Only the elements different from those shown in FIG. 14 will be described hereinbelow.

Mixers 215-1 to 215-n of the receiving unit 61 of the system 60 transform the respective output frequencies of the preamplifiers 4-1 to 4-n into different frequencies, respectively in the same way as with the case of the mixers 5-1 to 5-n. In this third embodiment, however, different reference signals 241-1 to 241-n of different reference frequencies $\omega_{1r}$ to $\omega_{1n}$ are supplied from a synthesizer 221 of a filter group control circuit 212 to the mixers 215-1 to 215-n, respectively.

In more detail, if the reference frequency $\omega_{1r}$ to the mixer 215-1 is $\omega_{1r} = \omega_r$, the reference frequency $\omega_{2r}$ for the mixer 215-2 is set as $$\omega_{2r} = \omega_r - \gamma \cdot G_z \cdot L$$

Similarly, the reference frequencies $\omega_{3r}$ to $\omega_{nr}$ for the other mixers 215-3 to 215-n are set in the same way being offset $\gamma \cdot G_z \cdot L$ by $\gamma \cdot G_z \cdot L$. When the respective frequencies $\omega_1$ $\gamma \sim \omega_n$ $\gamma$ are allowed to be different from each other, frequencies of the output signals of the mixers 215-1 to 215-n lie within the same frequency range. In other words, in spite of the fact that the Larmor frequencies $\omega_1$ to 107 $n$ at the central positions of the small receiving coils 2-1 to 2-n are offset $\gamma \cdot G_z \cdot L$ by $\gamma \cdot G_z \cdot L$, the output signals of the mixers 215-1 to 215-n are the same in frequency.

For instance, since the Larmor frequency at the central position of the small receiving coil 2-1 is $$\omega_1 = \gamma(G_2 \cdot (T-D)+B_o)$$

The frequencies of the output signals from the mixer 215-1 corresponding thereto are $\gamma(G_2 \cdot (T-D)+B_o)+\omega_r$ ... (in 1st signal)

$\gamma(G_2 \cdot (T-D)+B_o)-\omega_r$ ... (in 2nd signal)

On the other hand, since the Larmor frequency at the central position of the small receiving coil 2-2 is $$\omega_2 = \gamma(G_z(T-D-L)+B_o)$$

The frequencies of the output signals from the mixer 215-2 corresponding thereto are $\gamma(G_z(T-D-L)+B_o)+(\omega_r-\gamma \cdot G_z \cdot L)$ ... (in 1st signal)

$$\gamma(G_x(T-D-L)+B_o)-(\omega_r-\gamma\cdot G_xL) \ldots \text{(in 2nd signal)}$$

However, since the first high-frequency signals outputted from the mixers 215-1 and 215-2 are not passed through filters 216-1 and 216-2 connected to the succeeding stage, it is unnecessary to take the frequencies of the first signals into account. That is, the second signal outputted from the mixer 215-1 is the same in frequency as that from the mixer 215-2. In the same way, the frequency ranges of the output signals of all the mixers 215-1 to 215-n are equal to each other. In this third embodiment, therefore, it is possible to simplify the setting of the filter passbands, because all the passbands of the filters 216-1 to 216-n are set in the same way. Namely, the passband lower and upper limits of the filters 216-1 to 216-n are set as follows:

$$\omega_{21L}=\gamma(G_x(T-D)+B_o)-\omega_r-(\Delta\omega/2)K$$

$$\omega_{21H}=\gamma(G_x(T-D)+B_o)-\omega_r+(\Delta\omega/2)K$$

The reference signals 241-1 to 241-n with reference frequencies $\omega_{1r}$ to $\omega_{nr}$ (the same as applied to the mixers 215-1 to 215-n) are also applied to the mixers 222-1 to 222-n, respectively from the synthesizer 221. In response to the reference signals 241-1 to 214-n, the respective mixers 215-1 to 215-n generate signals whose frequencies are returned to those of the signals outputted by the small receiving coils 2-1 to 2-n, by adding the respective reference frequencies $\omega_{1r}$ to $\omega_{nr}$ to the frequencies of the output signal of the respective filters 216-1 to 216-n. On the other hand, although the respective mixers 215-1 to 215-n generate signal whose frequencies are obtained by subtracting the respective reference frequencies $\omega_{1r}$ to $\omega_{rn}$ from the frequencies of the output signals of the respective filters 216-1 to 216-n, these signals are eliminated through the high-pass filter 23.

In setting the reference frequencies, the processor 10 transmits reference frequency information signals 242 indicative of the respective reference frequencies $\omega_{1r}$ to $\omega_{nr}$ (to be supplied to the respective mixers 215-1 to 215-n) to a register 225 via an interfacer 224, and stores them in the register 225 as the reference frequency data. Although only a single register 225 is shown in FIG. 16, it is necessary to provide a plurality of registers 225 for storing data indicative of the respective reference frequencies $\omega_{1r}$ to $\omega_{nr}$. In response to the signals from the register 225, the synthesizer 221 outputs the respective reference signals 241-1 to 214-n of the respective reference frequencies $\omega_{1r}$ to $\omega_{nr}$ to the respective mixers 215-1 to 215-n and 222-1 to 222-n.

In addition, the processor 10 transmits passband information signals 233 indicative of the passband lower and upper limits $\omega_{21L}$ and $\omega_{21H}$ of the filters 216-1 to 216-n to a register 227 via the interface 224 and stores them in the register 227 as the passband data. The register 227 supplies passband control signals 213 according to the data indicative of the passband lower and upper limits $\omega_{21L}$ and $\omega_{21H}$ to the respective filters 216-1 to 216-n to set the passbands $\omega_{21L}$ to $\omega_{21H}$ of the respective filters 216-1 to 216-n.

In the magnetic resonance imaging systems 40 to 60 as shown in FIGS. 14 and 16, it is also possible to transform the frequencies of the signals outputted from the preamplifiers 4-1 to 4-n into higher frequencies by outputting high-frequency signals from the mixers 5-1 to 5-n or 215-1 to 215-n. In this case, high-frequency filters of passbands higher than those of the Larmor frequency bands are used as the filters 116-1 to 116-n or 216-1 to 216-n, and a low-pass filter is used instead of HPF23.

Figure 17:
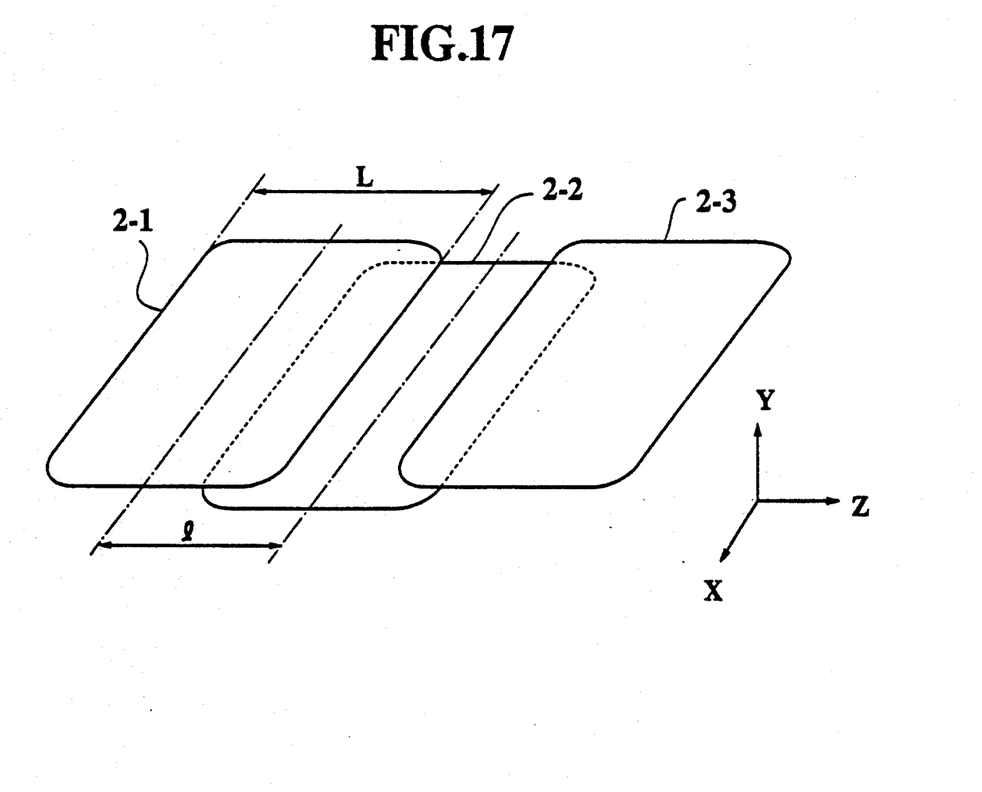
FIG. 17 is an illustration showing another example of arrangement of the small receiving coils 2-1 to 2-n of the first to third embodiments of the imaging system according to the present invention.

In the above-mentioned first to three embodiments, the small receiving coils 2-1 to 2-n are arranged side by side on the same plane without being overlapped with each other. Without being limited thereto, it is also possible to arrange the small receiving coils 2-1 to 2-n so as to be overlapped with each other as shown in FIG. 17. In the case where the respective small receiving coils are overlapped with each other, there exists such an advantage that the intensity of the electromagnetic coupling between the two overlapped small receiving coils is reduced. As described above, the present invention is operative and effective even if the pitch 1 between the two overlapped small receiving coils 2-1 to 2-n is determined shorter than the length L of each small receiving coil 2-1 to 2-n. In this case, although the noise elimination effect through the filters is a little reduced, there exists such an advantage that it is possible to allow the frequency distribution of the output signals of the adder 7 to be flat, after a plurality of filter outputs are added, even if the passband width of the filter is not determined sufficiently wide as compared with $\Delta\omega=\gamma\cdot G_r L$. In other words, it is possible to enable the final sensitivity distribution to be flat that in the Z-axis direction.

Embodiments of the present invention has been explained by way of example. Without being limited thereto, however, various modification can be made. For instance, in the above-mentioned first to three embodiments, the small receiving coils 2-1 to 2-n are arranged in the direction of the static magnetic field, that is, on the same plane in the Z-axis direction. Without being limited thereto, however, it is obvious that the present invention is operative even when these small receiving coils 2-1 to 2-n are arranged in the X-axis direction or the Y-axis direction. In more detail, when a gradient magnetic field is applied in the X-axis direction and further the Larmor frequency $\omega$ is changed in the X-axis direction to obtained data, the small receiving coils 2-1 to 2-n are arranged on the same plane in the X-axis direction, and further the filter passbands are controlled according to the intensity of the grandient magnetic field applied in the X-axis direction and the X-coordinates of the small receiving coils 2-1 to 2-n, in the same way as in the first to third embodiments. The same is applicable to the Y-axis direction.

Further, although surface coils for only receiving MR signals are used as the small receiving coils 2-1 to 2-n in the above-mentioned first to third embodiments, it is of course possible to adopt transmitting/receiving coils, divided solenoid-shaped coils, Helmholtz coils, etc. as the small receiving coils.

What is claimed is:

1. A magnetic resonance imaging system comprising:
   a plurality of receiving coils for receiving a plurality of MR (magnetic resonance) signals generated from plural portions of an MR signal source;
   a plurality of filters, each coupled to a different one of said plurality of receiving coils, for filtering said plurality of MR signals to obtain a plurality of filtered MR signals;
   filter passband setting means for setting passbands of said plurality of filters with each of said plurality of filtered MR signals having a frequency band different from each other; and means for combining the filtered MR signals which are derived from the filters coupled to at least two receiving coils selected from said plurality of receiving coils.

2. A magnetic resonance imaging system as claimed in claim 1, wherein said plurality of receiving coils are arranged along an axis of an object under medical examination provided as said MR signal source.

3. A magnetic resonance imagining system as claimed in claim 1, wherein said plurality of receiving coils are arranged such that at least portions of the respective coils overlap with each other.

4. A magnetic resonance imaging system as claimed in claim 1, wherein said filter passband setting means includes:

a processor for selecting frequency bands based on Larmor frequency data corresponding to positions of said receiving coils, as passbands of said filters, to produce passband determining signals; and a filter passband setting circuit for supplying passband control signals to said plurality of filters in response to the passband determining signals to set said filters.

5. A magnetic resonance imaging system as claimed in claim 4, wherein said filter passband setting circuit includes:

an interface for converting said passband determining signals into passband data; and register means for storing said passband data to read out said passband control signals corresponding to the passband data.

6. A magnetic resonance imaging system as claimed in claim 5, wherein said register means includes:

first registers for storing passband upper limit data of said filters to read out passband upper limit control signals corresponding to the passband upper limit data;

second registers for storing passband lower limit data of said filters to read out passband lower limit control signals corresponding to the passband lower limit data, said plurality of filters comprising:

low-pass filters for filtering said plurality of MR signals to obtain a plurality of MR signals having frequencies lower than said passband upper limits of said filters in response to said passband upper limit control signals from said first registers; and, high-pass filters for filtering said plurality of MR signals to obtain a plurality of MR signals having frequencies higher than said passband lower limits of said filters in response to said passband lower limit control signals from said second registers.

7. A magnetic resonance imaging system comprising:

a plurality of receiving coils for receiving a plurality of MR signals generated from plural portions of an MR signal source;

reference frequency signal producing means for producing a plurality of reference frequency signals;

a plurality of mixers each for mixing a different one of said plurality of reference frequency signals with one of said plurality of MR signals having original frequencies outputted from said receiving coils thereby to obtain a plurality of MR signals having a plurality of different first frequencies different from said original frequencies thereof;

a plurality of filters each coupled to a different one of said plurality of mixers for filtering said plurality of MR signals having said plurality of different first frequencies to obtain a plurality of filtered MR signals;

filter passband setting means for setting passbands of said plurality of filters with each of said plurality of filtered MR signals having a frequency band different from each other; and, means for combining the filtered MR signals which are derived from the filters coupled to at least two receiving coils selected from said plurality of receiving coils.

8. A magnetic resonance imaging system as claimed in claim 7, wherein said mixers convert said plurality of MR signals having original frequencies into said first frequencies, with said first frequencies lower than said original frequencies.

9. A magnetic resonance imaging system as claimed in claim 8, wherein said reference frequency signal producing means includes:

a processor for selecting frequencies based on Larmor frequencies corresponding to positions of said receiving coils, as said reference frequencies, to produce reference frequency determining signals; and, a reference frequency setting circuit for setting said reference frequency signals supplied to said mixers in response to said reference frequency determining signals.

10. A magnetic resonance imaging system as claimed in claim 9, wherein said reference frequency setting circuit includes;

an interface for converting said reference frequency determining signals from said processor into reference frequency data;

registers for storing said reference frequency data to read out reference frequency control signals corresponding to said frequency data; and, a synthesizer for producing said reference frequency signals in response to said reference frequency control signals read out from said registers.

11. A magnetic resonance imaging system as claimed in claim 7, wherein said mixers convert said plurality of MR signals having original frequencies into said first frequencies, with said first frequencies higher than said original frequencies.

12. A magnetic resonance imaging system as claimed in claim 11, wherein said reference frequency signal producing means includes:

a processor for selecting frequencies based on Larmor frequencies corresponding to positions of said receiving coils, as said reference frequencies, to produce reference frequency determining signals; and, a reference frequency setting circuit for setting said reference frequency signals supplied to said mixers in response to said reference frequency determining signals.

13. A magnetic resonance imaging system as claimed in claim 12, wherein said reference frequency setting circuit includes:

an interface for converting said reference frequency determining signals from said processor into reference frequency data;

registers for storing said reference frequency data to read out reference frequency control signals corresponding to said frequency data; and, a synthesizer for producing said reference frequency signals in response to said reference frequency control signals read out from said resisters.

14. A magnetic resonance imaging system as claimed in claim 7, further comprising:
a second mixer for mixing said reference frequency signals with said MR signals having said first frequencies outputted from said combining means to obtain MR signals having said original frequencies.

15. A magnetic resonance imaging system as claimed in claim 14, further comprising:
a second filter for filtering said MR signals outputted from said second mixer to pass second filtered MR signals having said original frequencies.

16. A magnetic resonance imaging system comprising:
a plurality of receiving coils for receiving a plurality of MR signals generated from plural portion of an MR signal source;
reference frequency signal producing means for producing a plurality of reference frequency signals different from each other;
a plurality of mixers each for mixing a different one of said plurality of reference frequency signals with one of said plurality of MR signals having original frequencies outputted from said receiving coils, respectively, thereby to obtain a plurality of MR signals having a plurality of first frequencies equal to each other and different from said original frequencies thereof;
a plurality of filters each coupled to a different one of said plurality of mixers for filtering said plurality of MR signals having said plurality of first frequencies to obtain a plurality of filtered MR signals;
filter passband setting means for setting passbands of said plurality of filters with each of said plurality of filtered MR signals having a frequency band equal to each other;
a plurality of second mixers for mixing said reference frequency signals supplied from said reference frequency signal producing means with said filtered MR signals having said first frequencies outputted from said filters, respectively, thereby to obtain MR signals having said original frequencies;
means for combining the MR signals from said plurality of second mixers coupled to at least two receiving coils selected from said plurality of receiving coils; and,
a second filter for filtering said MR signals outputted from said combining means to pass MR signals having said original frequencies.

17. A magnetic resonance imaging system as claimed in claim, 16 wherein said reference frequency signal producing means includes:
a processor for selecting frequencies based on Larmor frequencies corresponding to positions of said receiving coils, as said reference frequencies, to produce reference frequency determining signals; and,
a reference frequency setting circuit for setting said reference frequency signals supplied to said mixers in response to said reference frequency determining signals.

18. A magnetic resonance imaging system as claimed in claim 16, wherein said reference frequency setting circuit includes:
an interface for converting said reference frequency determining signals from said processor into reference frequency data;
registers for storing said reference frequency data to read out reference frequency control signals corresponding to said frequency data; and,
a synthesizer for producing said reference frequency signals in response to said reference frequency control signals read out from said resisters.

* * * * *